United States Patent
Liu

(10) Patent No.: US 9,564,453 B2
(45) Date of Patent: Feb. 7, 2017

(54) ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Sha Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 98 days.

(21) Appl. No.: 14/127,528

(22) PCT Filed: Nov. 23, 2012

(86) PCT No.: PCT/CN2012/085175
§ 371 (c)(1),
(2) Date: Dec. 19, 2013

(87) PCT Pub. No.: WO2014/015591
PCT Pub. Date: Jan. 30, 2014

(65) Prior Publication Data
US 2015/0221670 A1   Aug. 6, 2015

(30) Foreign Application Priority Data
Jul. 27, 2012   (CN) .......................... 2012 1 0266429

(51) Int. Cl.
*H01L 27/14*   (2006.01)
*H01L 29/04*   (2006.01)
(Continued)

(52) U.S. Cl.
CPC ......... *H01L 27/124* (2013.01); *G02F 1/13624* (2013.01); *H01L 27/1248* (2013.01);
(Continued)

(58) Field of Classification Search
CPC ................. G02F 1/13624; G02F 2001/134345
See application file for complete search history.

(56) References Cited

U.S. PATENT DOCUMENTS 5,434,686 A *  7/1995  Kanemori ........... G02F 1/13624
                                                    345/93
7,750,998 B2 *  7/2010  Tanno ............... G02F 1/134363
                                                    345/88
(Continued)

FOREIGN PATENT DOCUMENTS

CN          1912719 A     2/2007
CN        101295115 A    10/2008
(Continued)

OTHER PUBLICATIONS

International Search Report (Chinese language) issued by the State Intellectual Property Office ("SIPO") for PCT/CN2012/085175 on Apr. 23, 2013, 18 pages.
(Continued)

*Primary Examiner* — Jesse Y Miyoshi
(74) *Attorney, Agent, or Firm* — Ladas & Parry LLP

(57) ABSTRACT

An array substrate and a display device are provided, and the array substrate, comprising: a substrate; and gate lines (2) and data lines (1), formed on the substrate and configured to defining pixel units, wherein, each data line (1) is located in a middle part of a corresponding pixel unit and configured to dividing each pixel unit into a first sub-pixel unit (7) and a second sub-pixel unit (8), wherein the first sub-pixel unit (7) is connected to one thin film transistor (6) and the second sub-pixel unit (8) is connected to one thin film transistor (6) for independent charging, and the thin film transistors (6) are located in a region corresponding to the corresponding gate line. The data line (1) is arranged in the middle of the corresponding pixel unit, and the first sub-pixel unit (7) and the second sub-pixel unit (8) are connected to two individual thin film transistors (6) to be independently charged, a width of the gate line can be greatly reduced, and the aperture ratio of the pixel can be improved.

14 Claims, 5 Drawing Sheets

(51) Int. Cl.
*H01L 27/12* (2006.01)
*G02F 1/1362* (2006.01)
*H01L 29/417* (2006.01)
*H01L 29/786* (2006.01)
*G02F 1/1343* (2006.01)

(52) U.S. Cl.
CPC .. *H01L 29/41733* (2013.01); *H01L 29/78633* (2013.01); *G02F 1/136286* (2013.01); *G02F 2001/134345* (2013.01)

(56) References Cited

U.S. PATENT DOCUMENTS

| | | | | |
|---|---|---|---|---|
| 2002/0180920 | A1* | 12/2002 | Noh | G02F 1/134363 349/141 |
| 2004/0125057 | A1* | 7/2004 | Moon | G09G 3/3648 345/87 |
| 2008/0042217 | A1* | 2/2008 | Jeong | G02F 1/1368 257/390 |
| 2008/0100555 | A1 | 5/2008 | Yoon et al. | |

FOREIGN PATENT DOCUMENTS

| | | |
|---|---|---|
| CN | 101398587 A | 4/2009 |
| CN | 102053430 A | 5/2011 |
| CN | 201867560 U | 6/2011 |
| CN | 102759833 A | 10/2012 |
| JP | 2010128004 A | 6/2010 |

OTHER PUBLICATIONS

First Office Action (Chinese language) issued by SIPO for application No. 201210266429.6 on May 5, 2014, 4 pages.
English translation of first Office Action issued by SIPO for application No. 201210266429.6, 3 pages.
English abstract of CN 102759833A, 2 pages.
English abstract of CN 201867560U, 2 pages.
English abstract of CN 101295115A, 1 page.
English abstract of CN 1912719A, 2 pages.
English abstract of JP 2010128004A, 1 page.
English abstract of CN 101398587A, 2 pages.
Second Chinese Office Action dated Nov. 2, 2014; Appln. No. 201210266429.6.
International Preliminary Report on Patentability dated Jan. 27, 2015; PCT/CN2012/085175.

* cited by examiner

ARRAY SUBSTRATE AND DISPLAY DEVICE

CROSS REFERENCE TO RELATED APPLICATIONS

This application is based on International Application No. PCT/CN2012/-85175 filed on Nov. 23, 2012, which claims priority to Chinese Application No. 201210266429.6 filed on Jul. 27. 2012, the contents of which are incorporated herein by reference.

TECHNICAL FIELD

Embodiments of the present invention relate to an array substrate having a pixel structure easily repaired with a higher aperture ratio and a display device.

BACKGROUND

In the manufacture field of a thin film transistor liquid crystal display (TFT-LCD), a transmittance of a panel is an important product performance.

With the development of lithography and manufacture technology, a more sophisticated structure of the panel can be produced. In the prior art, loss of an aperture ratio is reduced by continuously decreasing a width of a data line, however as the width of the data line decreases, a phenomena of an open circuit of the data line may occur with a higher possibility, design and manufacture of a pixel structure having a high aperture ratio and easy to repair, will have broad application prospects.

FIG. 1 is a schematic view of a conventional pixel structure. The pixel structure comprises a data line 1, a pixel unit and a gate line 2, wherein the data line 1 is located at one side of the pixel unit. The current pixel structure is designed to have a two-domain structure formed of upper and lower domains, so as to avoid a phenomena of color shift, and an irregular shape of a electrode may inevitably appears in a middle part of the pixel structure, a liquid crystal disorder will occur at an interface region 3 of the upper and lower domains, and which is easy to produce more dark regions, and affecting an entire transmittance of the pixel structure.

SUMMARY

(I) Technical Problem to be Solved

An object of the embodiment of the present invention is to provide an array substrate and a display device having a pixel structure with a higher aperture ratio.

(II) Technical Solution

To achieve the above object, in an aspect, the embodiment of the present invention provides an array substrate comprising: a substrate; and gate lines and data lines, formed on the substrate and configured to defining pixel units, wherein, each data line is located in a middle part of a corresponding pixel unit and configured to dividing each pixel unit into a first sub-pixel unit and a second sub-pixel unit, wherein the first sub-pixel unit is connected to one thin film transistor and the second sub-pixel unit is connected to one thin film transistor for independent charging, and the thin film transistors are located in a region corresponding to the corresponding gate line.

Further, each data line is located in the corresponding pixel unit in a middle position.

Further, a common electrode and pixel electrodes are formed on the array substrate, and slits are formed in the common electrode and/or the pixel electrodes; the slits in a same sub-pixel unit have the same direction; moreover, the directions of the slits of the first sub-pixel unit and the second sub-pixel unit in both sides of the same data line are symmetric about the data line.

Further, a light shielding layer for blocking a data line region on a color filter substrate overlaps a region corresponding to an intersection region of the first sub-pixel unit and the second sub-pixel unit.

Further, a drain electrode of the thin film transistor and the pixel electrode are connected through a via hole.

Further, an angle is formed between the directions of the slits of the pixel electrodes in the first sub-pixel unit and the second sub-pixel unit, the via holes are provided in the first sub-pixel unit and the second sub-pixel unit at an unoccupied region.

Further, when an opening of the angle formed between the directions of the slits of the pixel electrodes in the first sub-pixel unit and the second sub-pixel units is towards the thin film transistor, the via holes are provided in a bottom of the data line and at positions closer to the data line at both sides of the data line.

Further, when an opening of the angle formed between the directions of the slits of the pixel electrodes in the first sub-pixel unit and the second sub-pixel units is towards a direction opposite to the thin film transistor, the via holes are provided in a bottom of the data line and at positions far away from the data line.

Further, a source electrode of each of the thin film transistor is connected to the adjacent data line through two separate connection electrodes; the connection electrode and the source electrode of the thin film transistor, the data line are formed by the same process.

In another aspect, an embodiment of the present invention further provides a display device including the above-mentioned array substrate.

(III) Advantageous Effect

Embodiments of the invention have the following advantages: the array substrate and the display device provided in the embodiments of the present invention adopts a structure in which a data line is provided in the middle of a corresponding pixel unit, and is connected to two separate thin film transistors for charging simultaneously; since the same one pixel is charged by two thin film transistors, a width to length ratio of a channel of each thin film transistor can be reduced accordingly, while since the thin film transistor of the embodiments of the present invention as a whole is located above gate lines, a width of the gate electrode of the thin film transistor is decreased, that is, a width of the gate line is reduced. Accordingly, using the solutions provided by the embodiments of the present invention, a width of a gate line can be greatly reduced, the pixel aperture ratio can be improved.

BRIEF DESCRIPTION OF THE DRAWINGS

In order to clearly illustrate the technical solution of the embodiments of the invention, the drawings of the embodiments will be briefly described in the following; it is obvious

Wherein: 1: data lines; 2: gate lines; 3: intersection regions; 4: common electrode line; 5: pixel electrodes; 6: thin film transistors; 7: first sub-pixel unit; 8: second sub-pixel unit; 9: via holes.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined herein, the technical terms or scientific terms used herein should have a generally meaning understood by those skilled in the art of the present invention. The "first", "second", and similar terms used in the specification and claims of the present invention do not represent any order, quantity, or importance, but are used merely to distinguish different components. Likewise, "a" or "an" and other similar words do not mean quantitative restrictions, but rather indicates the presence of at least one. "Includes" or "including" and other words of similar meaning denotes elements or objects that appears in front of "includes" or "including" cover those enumerated behind "includes" or "including" or their equivalents, but does not exclude other elements or objects. "Connect" or "connected" and other similar words are not limited to physical or mechanical connections, but can include electrical connections, either directly or indirectly. "Upper", "lower", "left", "right" are only used to indicate the relative positional relationship, when the described objects change in the absolute position, the relative positional relationship may also be changed accordingly.

Figure 2:
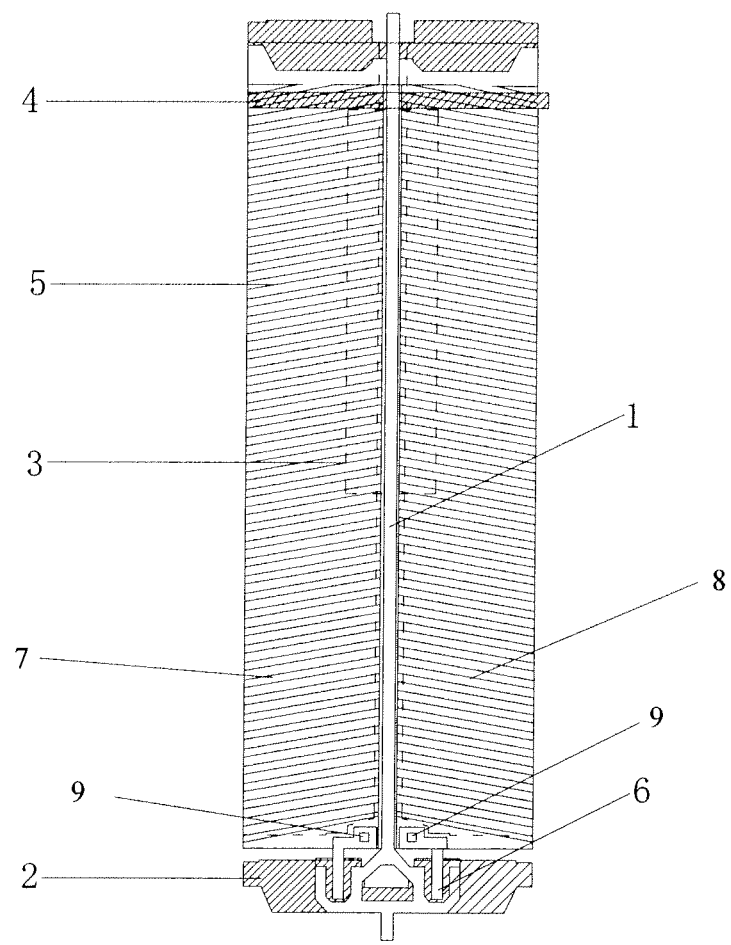
FIG. 2 is a schematic view of a pixel structure according to an embodiment of the present invention.
Figure 3:
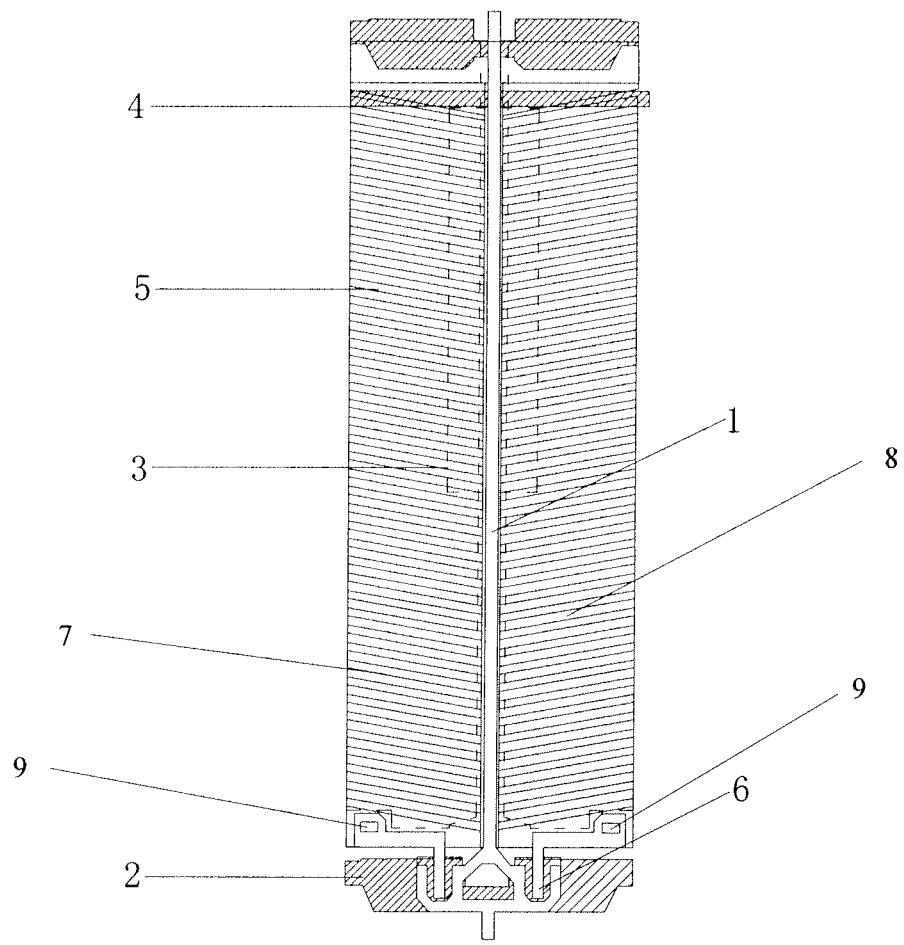
FIG. 3 is a schematic view of a pixel structure according to another embodiment of the present invention.
Figure 4:
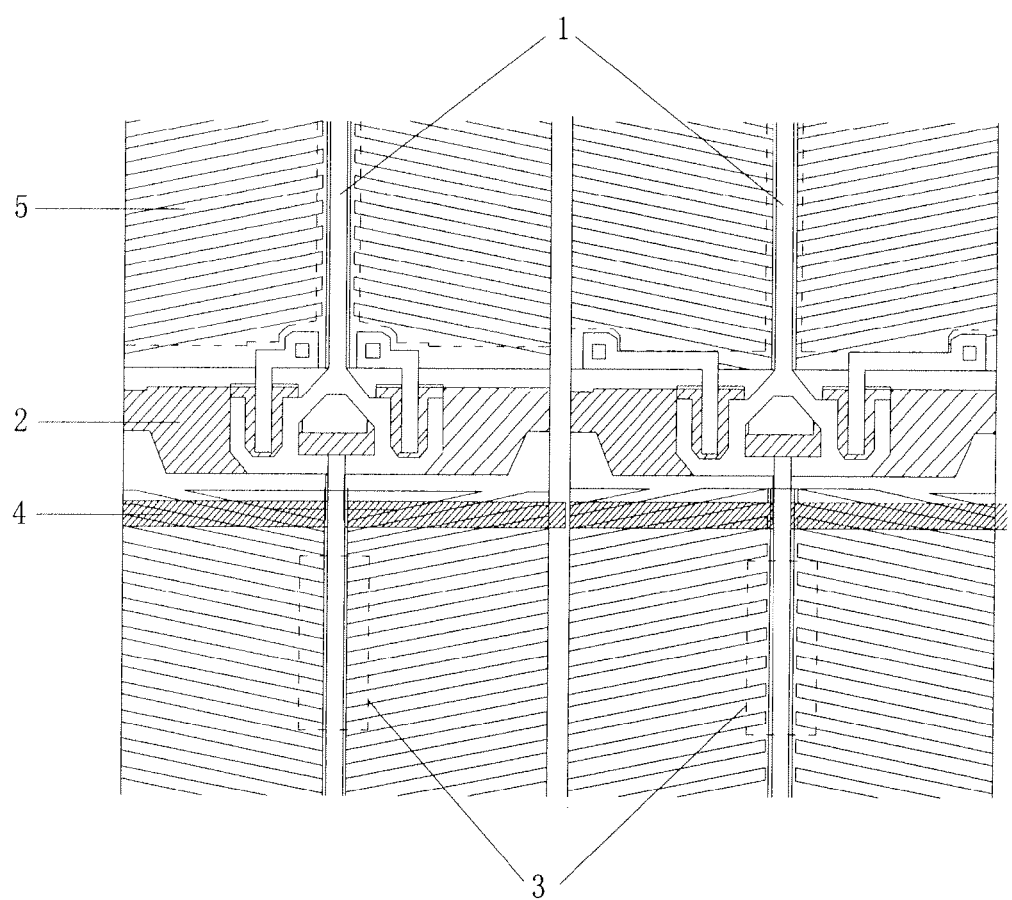
FIG. 4 is a schematic view of a staggered structure of a pixel structure according to an embodiment of the present invention.

As shown in FIGS. 2 to 4, an embodiment of the present invention provides an array substrate, including a substrate and gate lines 2 and data lines 1 formed on the substrate, the gate lines 2 and the data lines 1 define a plurality of pixel units, each of the data lines 1 is located in the middle of the corresponding pixel units, for example, each data line 1 is located in an intermediate position of the corresponding pixel unit, so that the corresponding pixel unit is divided into a first sub-pixel unit 7 and a second sub-pixel unit 8.

The first sub-pixel unit 7 and the second sub-pixel unit 8 are each separately connected to one thin film transistor 6 for charging independently, and a whole of the thin film transistor 6 is located in a region corresponding to the corresponding gate line. Since the same one pixel is charged by two thin film transistors, a ratio of a width and a length of a channel of each of the thin film transistors can be reduced accordingly, that is a width of a gate electrode of the thin film transistor can be reduced; Also in the embodiment, the gate line is used as the gate electrode of the TFT, the width of the gate electrode is reduced, that is, the width of the gate line can be reduced, thereby a aperture ratio can be improved.

For example, the data line 1 is located in the middle of the pixel unit, such that the first sub-pixel unit 7 and the second sub-pixel unit 8 have a same area, thereby ensuring the same charge effect of the TFT.

By arranging the data line 1 in an middle portion of the pixel unit, and equally dividing the pixel unit into a first sub-pixel unit 7 and a second sub-pixel unit 8, meanwhile by charging the first sub-pixel unit and the second sub-pixel unit using two separate TFT switches, the loss of aperture ratio and transmittance caused by the crossing of two domains in a center portion of the pixel unit of a traditional array substrate are avoided and the occurrence of color shift can be effectively avoided, meanwhile the loss of aperture ratio of the pixel caused by a light shielding layer above the data line 1 and an impact caused by a stagger of the slits of the pixel electrodes in the array substrate are overlapped together, so as to ensure that a pixel structure with regular slits are presented in the pixel region, thus, optimizing the pixel structure, reducing the loss of the aperture ratio, while ensuring uniformity of the transmittance of the pixel.

Figure 1:
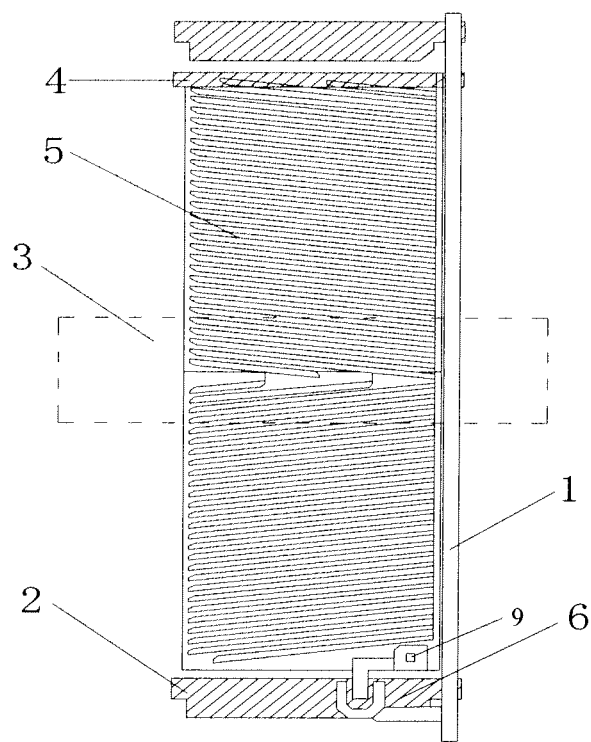
FIG. 1 is a schematic diagram of a conventional pixel structure in the prior art.

In the embodiment, the first sub-pixel unit 7 and the second sub-pixel unit 8 are simultaneously charged by two TFTs, respectively, when a pixel unit is divided into two parts, each part only requires half of the TFT in prior art (e.g., TFT 6 of FIG. 1) to achieve normal charge, the gate line is used as a gate electrode of the TFT, so that the width of the gate line can be decreased in half, such that the aperture ratio is increased. Specifically, taking a width to length ratio of TFT of a pixel electrode in a size of 46-inches as a example, a width to length ratio (W/L) of TFT channel in conventional structure is 58 μm/5.0 μm, theoretically, if designed in accordance with the present invention, the width to length ratio (W/L) of each TFT channel can be achieved to 29 μm/5.0 μm, the decrease of the width of TFT channel can greatly reduce the line width of the scanning line, so that the aperture ratio of the pixel can be greatly improved. Taking a pixel structure in a size of 46-inches as an example, the aperture ratio can be improved by 2.6% by calculation using the present pixel structure.

As compared with the prior art, when the data lines are disposed in the middle position of the pixel units, it is not necessary for a black matrix to be arranged in its corresponding position in the prior art (i.e., at both sides of each pixel unit where each data line is disposed), since liquid crystal between the pixel units is acted by the pixel electrodes in left and right directions, a horizontal electric field formed by the two pixel electrodes is consistent with a rubbing direction, thus the liquid crystal will not be rotated, neither does a light leakage occur at the position, the display quality can be ensured.

A common electrode and the pixel electrodes are formed on the array substrate, and slits are formed in the common electrode and/or pixel electrodes; the slits have same direction in the same sub-pixel unit; Moreover, the directions of the slits in the first sub-pixel unit and the second sub-pixel unit on both sides of a same data line are symmetric with respect to the data line.

In the present embodiment, a structure where the common electrode is under the pixel electrode (that is the common electrode is closer to the substrate, the pixel electrode is closer to the liquid crystal layer) is taken as an example. The common electrode is connected to the common electrode line 4 to obtain a common voltage; the pixel electrodes 5 are connected to the drain electrodes of the thin film transistors through via holes.

It can be seen from FIGS. 2 to 5, the pixel electrode 5 of the present embodiment is formed with slits, and the slits of the pixel electrode 5 at both sides of the data line are symmetrically arranged with respect to the data line.

Wherein a pixel unit intersection region 3 (low light efficiency region) of the first sub-pixel unit 7 and the second sub-pixel unit 8 are covered by a light shielding layer disposed on a color filter substrate for shielding the data line region, thereby optimizing the pixel structure, reducing the loss of aperture ratio.

Herein, a drain electrode of the TFT is connected to the pixel electrode 9 through a via hole. An angle is formed between the slit directions of the pixel electrode 5 in the first sub-pixel unit 7 and the second sub-pixel unit 8, the via holes 9 are arranged at unoccupied regions in the first sub-pixel unit 7 and the second sub-pixel unit 8, respectively, so as to avoid the occupation of the pixel electrode region, achieve the maximum space savings.

Exemplarily, with reference to FIG. 2, when an opening of the angle formed between the direction of the slits of the pixel electrodes 5 in the first sub-pixel unit 7 and the second sub-pixel unit 8 is towards the thin film transistor, the via holes 9 are provided at a bottom of the data line 1 and at positions closer to the data line at both sides of the data line.

Referring to FIG. 3, when an opening of the angle formed between the directions of the slits of the pixel electrodes in the first sub-pixel unit 7 and the second sub-pixel unit 8 is towards a direction opposite to the thin film transistor, the via holes 9 are provided in the bottom of the data line and at positions far away from the data line.

By the above two structures, the pixel structure is optimized, a space occupying the pixel electrode can be reduced at a maximum degree, a minimized effect on the aperture ratio and transmittance are achieved.

Referring to FIG. 4, different from the existing panel display region, the pixel units in the display region of the present embodiment are not repeatedly arranged in a completely regular way, but two pixel structures with different directions in the pixel structures are alternately disposed, thereby avoiding the phenomenon of color shift as a whole.

Figure 5:
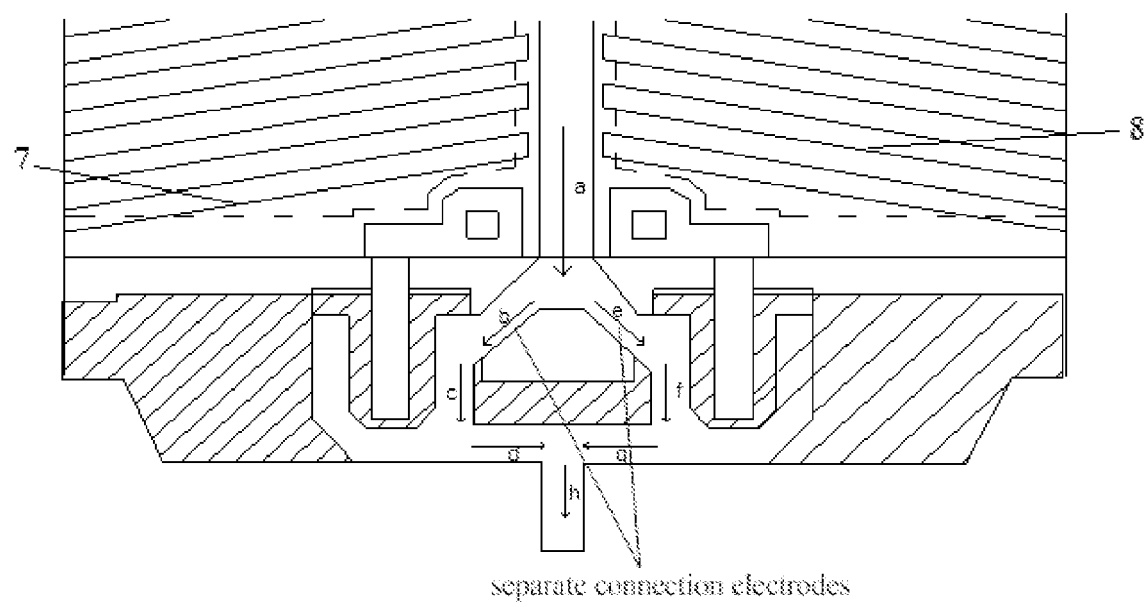
FIG. 5 is a schematic view of the principle for repairing the pixel structure according to an embodiment of the invention.

As shown in FIG. 5, an easily repair effect can be achieved in the TFT position of the embodiment of the present invention. The source electrode of each thin film transistor is connected to the adjacent data line by two separate connection electrodes, wherein "b" and "e" denote the two separate connection electrodes; the connection electrodes and the source electrode of the thin film transistor, the data line are formed by the same process.

Under a normal circumstance, the gate electrode 2 is inputted a gate signal, a charge signal is input through the data line 1, the inputted signal forms branches by flowing into two TFTs 6 and are charged independently into the first sub-pixel unit 7 and the second sub-pixel unit 8, particularly, the first sub-pixel unit 7 is charged through an a→b→c path, while the second sub-pixel unit 8 is charged through an a→e→f path, then the signal is transferred to the pixels in the next row by a→d→h path or a→g→h path.

When an data line open circuit (DO) appears at "b", the second sub-pixel unit 8 is normally charged, and the first sub-pixel unit 7 is charged by an a→e→f→g→d→c path, without affecting the charge effect of the pixel; Similarly, when the data line open circuit (DO) occurs at "e" of the second sub-pixel unit, the second sub-pixel unit is charged by an a→b→c→d→g→f path. Since the data line 1 and the gate line 2 do not have a vertically intersection region, an influence of the overlapping capacitance on a line delay is greatly reduced.

Since two TFTs at the left and right sides of the same data line is used to separately charge the sub-pixel unit 7 and the second sub-pixel unit 8 at the left and right sides, and when the data line open circuit (DO) or a data line and gate line short-circuit (DGS) occurs at one of the TFT, the other TFT can still be normally charged, thereby avoiding the above adverse effect on picture quality.

In the array substrate provided by the embodiments of the invention, the data line is arranged in the middle of the corresponding pixel unit, and is connected to two individual thin film transistors and the two individual thin film transistors are charged simultaneously, a width of the gate line can be greatly reduced, to improve the aperture ratio of the pixel, while, when an defect occurs in one of the pixel unit region, the other region will be normally charged, thus, the picture quality of products can be improved to the great extent.

Further, the embodiment of the present invention also provides a display device including the array substrate in the above-mentioned embodiment, the display device of the present embodiment includes, but not limited to, an LCD TV, a tablet computer, a liquid crystal display or other electronic display products.

The array substrate and the display device provided in the embodiments of the present invention adopts a structure in which a data line is arranged in the middle of a corresponding pixel unit, and two sub-pixel units are connected to two separate thin film transistors for charging simultaneously; since the same one pixel is charged by two thin film transistors, a width to length ratio of a channel of each thin film transistor can be reduced accordingly, while since the thin film transistor of the embodiments of the present invention as a whole is located above gate lines, a width of the gate electrode of the thin film transistor is decreased, that is, a width of the gate line is reduced. Accordingly, using the solutions provided by the embodiments of the present invention, a width of a gate line can be greatly reduced, the pixel aperture ratio can be improved.

The above description is only exemplary embodiments of the present invention, and not intended to limit the scope of the invention, the scope of the present invention should be defined by the appended claims.

The invention claimed is:

1. An array substrate, comprising:
    a substrate; and
    gate lines and data lines, formed on the substrate and configured to defining pixel units, wherein, each data line is located in a middle part of a corresponding pixel unit and configured to dividing each pixel unit into a first sub-pixel unit and a second sub-pixel unit, wherein the first sub-pixel unit is connected to one thin film transistor and the second sub-pixel unit is connected to another thin film transistor for independent charging, and the two thin film transistors are located in a region corresponding to the corresponding gate line,
    wherein a source electrode of each of the two thin film transistors is connected to the adjacent data line through two separate connection electrodes which includes a first connection electrode and a second connection electrode; the connection electrodes and the source electrodes of the two thin film transistors, the data line are formed by the same process, drain electrodes of the two thin film transistors and pixel electrodes formed on the array substrate are connected through a via hole, respectively, wherein the source electrode of each of the two thin film transistors is U-shaped, the drain electrode of each of the two thin film transistors is line-shaped, the U-shaped source electrodes of the two thin film transistors are parallel to each other and an opening of each of the two U-shaped source electrodes is toward the corresponding sub-pixel unit, a branch of each of the two U-shaped source electrodes is connected to the adjacent data line through the first connection electrode, and a bottom of each of the two U-shaped source electrodes is connected to the adjacent data line through the second connection electrode.

2. The array substrate according to claim 1, wherein, each data line is located in the corresponding pixel unit in a middle position.

3. The array substrate according to claim 1, wherein, a common electrode, and slits are formed in the common electrode and/or the pixel electrodes;

the slits in a same sub-pixel unit have the same direction; moreover, the directions of the slits of the first sub-pixel unit and the second sub-pixel unit in both sides of the same data line are symmetric about the data line.

4. The array substrate according to claim 1, wherein, an angle is formed between directions of slits of the pixel electrodes in the first sub-pixel unit and the second sub-pixel unit, the via holes are provided in the first sub-pixel unit and the second sub-pixel unit at an unoccupied region.

5. The array substrate according to claim 1, wherein, when an opening of the angle formed between directions of slits of the pixel electrodes in the first sub-pixel unit and the second sub-pixel units is towards the thin film transistors, the via holes are provided in a bottom of the data line and at positions closer to the data line at both sides of the data line.

6. The array substrate according to claim 1, wherein, when an opening of the angle formed between directions of slits of the pixel electrodes in the first sub-pixel unit and the second sub-pixel units is towards a direction opposite to the thin film transistors, the via holes are provided in a bottom of the data line and at positions far away from the data line.

7. A display device, comprising the array substrate according to claim 1.

8. The display device according to claim 7, wherein, each data line is located in the corresponding pixel unit in a middle position.

9. The display device according to claim 7, wherein, a common electrode, and slits are formed in the common electrode and/or the pixel electrodes;

the slits in a same sub-pixel unit have the same direction; moreover, the directions of the slits of the first sub-pixel unit and the second sub-pixel unit in both sides of the same data line are symmetric about the data line.

10. The display device according to claim 7, wherein, a light shielding layer for blocking a data line region on a color filter substrate overlaps a region corresponding to an intersection region of the first sub-pixel unit and the second sub-pixel unit.

11. The display device according to claim 7, wherein, an angle is formed between directions of slits of the pixel electrodes in the first sub-pixel unit and the second sub-pixel unit, the via holes are provided in the first sub-pixel unit and the second sub-pixel unit at an unoccupied region.

12. The display device according to claim 7, wherein, when an opening of the angle formed between directions of slits of the pixel electrodes in the first sub-pixel unit and the second sub-pixel units is towards the thin film transistor, the via holes are provided in a bottom of the data line and at positions closer to the data line at both sides of the data line.

13. The display device according to claim 7, wherein, when an opening of the angle formed between directions of slits of the pixel electrodes in the first sub-pixel unit and the second sub-pixel units is towards a direction opposite to the thin film transistor, the via holes are provided in a bottom of the data line and at positions far away from the data line.

14. The array substrate according to claim 1, wherein, a light shielding layer for blocking a data line region on a color filter substrate overlaps a region corresponding to an intersection region of the first sub-pixel unit and the second sub-pixel unit.

* * * * *